United States Patent
Hsu

(10) Patent No.: US 6,461,182 B1
(45) Date of Patent: Oct. 8, 2002

(54) SOCKET ON A PRINTED CIRCUIT BOARD

(76) Inventor: Feng-Chien Hsu, No. 6-1, Lane 114, Ming-Te St., Hsinchuang City, Taipei Hsien (TW)

(*) Notice: Subject to any disclaimer, the term of this patent is extended or adjusted under 35 U.S.C. 154(b) by 0 days.

(21) Appl. No.: 09/968,638

(22) Filed: Oct. 1, 2001

(51) Int. Cl.$^7$ .......................................... H01R 13/625
(52) U.S. Cl. ..................... 439/342; 439/857; 439/83
(58) Field of Search ........................... 439/342, 857, 439/856, 83

(56) References Cited

U.S. PATENT DOCUMENTS 6,142,810 A * 11/2000 Hsiao et al. ................. 439/342
6,319,038 B1 * 11/2001 Howell et al. .............. 439/342

* cited by examiner

Primary Examiner—Gary F. Paumen
(74) Attorney, Agent, or Firm—Alan Kamrath; Rider, Bennett, Egan & Arundel, LLP

(57) ABSTRACT

A socket on a PCB has a plurality of apertures. The apertures each have a stop formed on an inner wall, two recesses respectively defined beside the stop, and a rib formed on the stop. A plurality of connecting strips is respectively inserted in the apertures. The connecting strips each have an upright portion formed with two opposed first walls, a second wall extended between the first walls, and an opening. Two protrusions are respectively formed on the two first walls and received in the recesses. A lateral part is formed at the bottom of the upright portion and blocked by the rib. Each first wall includes a body, a head and a neck. The necks are twisted to define an outward taper from the second wall to the opening.

3 Claims, 4 Drawing Sheets

SOCKET ON A PRINTED CIRCUIT BOARD

BACKGROUND OF THE INVENTION

1. Field of the Invention

The present invention is related to a socket on a printed circuit board, and more particularly to a connecting strip in the socket.

2. Description of Related Art

In general, a CPU is detachably mounted in a socket on a main board of a computer. The socket is integrated with the main board and has a plurality of apertures in which pins of the CPU are inserted. A connecting strip is mounted in each aperture and is electrically connected to a respective pin of the CPU. Conventional connecting strips are inserted into the apertures through the ends of the apertures corresponding to the mounted chip and are held in position by fastening means in the apertures. However, when a CPU is removed from the socket, the conventional connecting strips may remain attached to the CPU pins and be pulled out through the upper ends of the apertures.

The invention provides an improved connecting strip for a socket to mitigate and/or obviate the aforementioned problem.

SUMMARY OF THE INVENTION

The main objective of the invention is to provide a socket in which connecting strips are securely mounted.

Other objectives, advantages and novel features of the invention will become more apparent from the following detailed description when taken in conjunction with the accompanying drawings.

BRIEF DESCRIPTION OF THE DRAWINGS

FIG. 3 is a side view in partial section of the connecting strip bonded on a printed circuit board;

DETAILED DESCRIPTION OF THE PREFERRED EMBODIMENT

Figure 1:
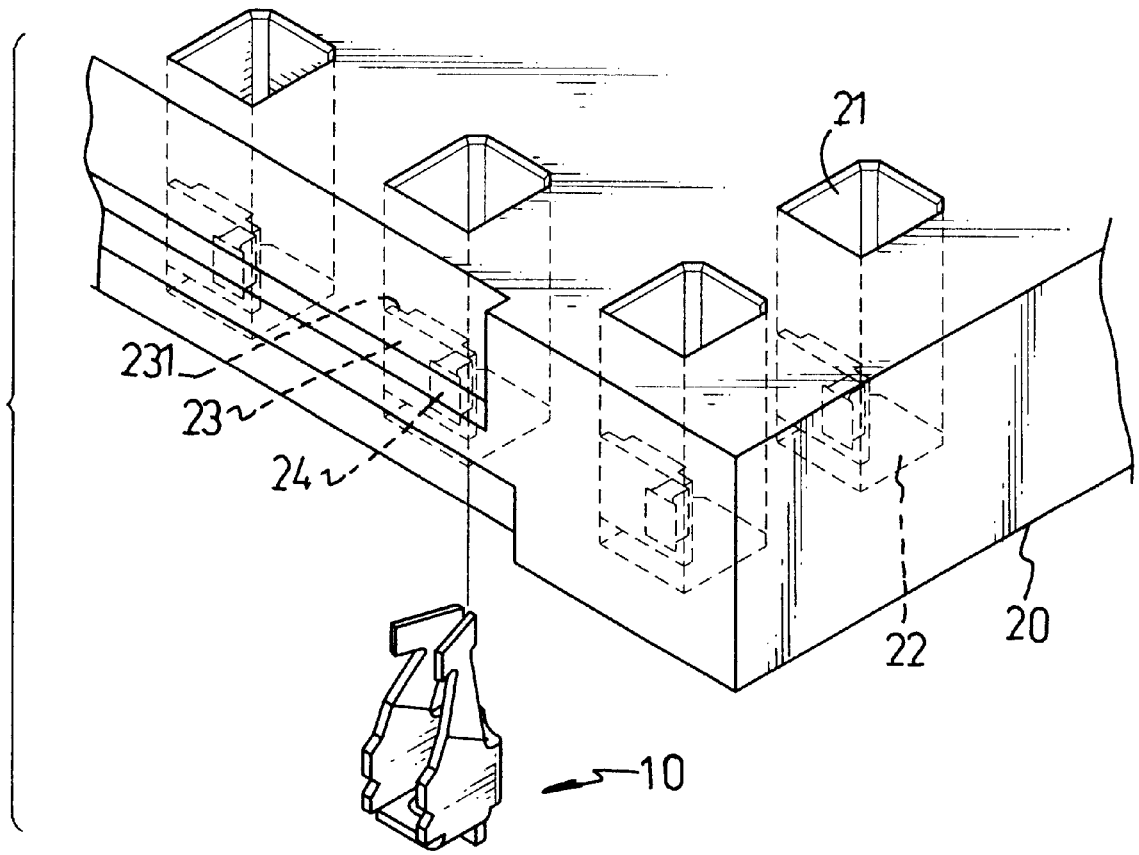
FIG. 1 is a partially exploded perspective view of a connecting strip and a socket in accordance with the invention.
Figure 2:
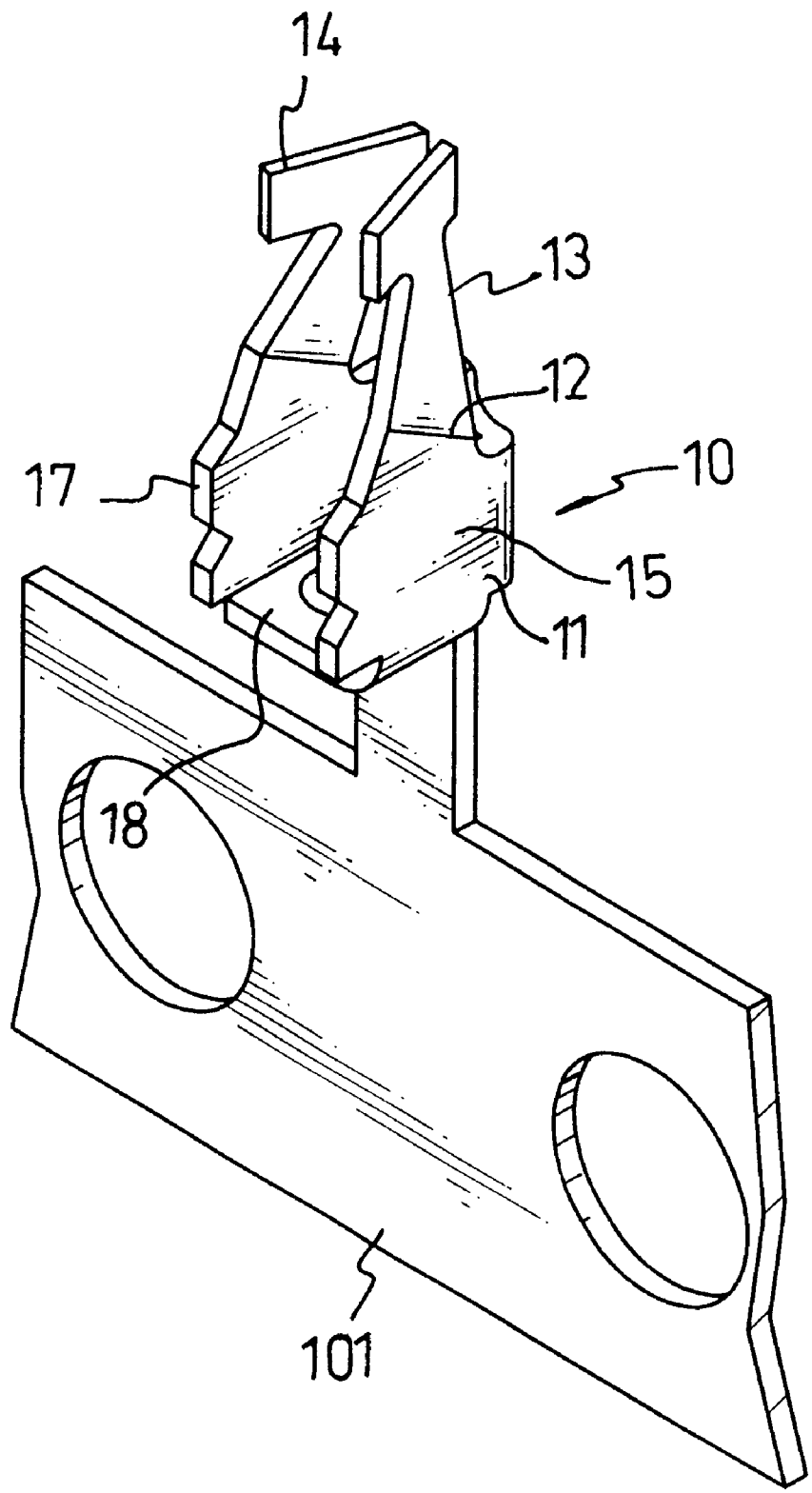
FIG. 2 is a perspective view showing that the connecting strip is made from a metal sheet.

With reference to FIGS. 1 and 2, a connecting strip (10) in accordance with the invention is made of a sheet metal (101) by punching. The connecting strip (10) has a bottom, a top, an upright portion (11) and a lateral part (18). The upright portion (11) has two opposed first walls, a second wall extended between respective first ends of the first walls and an opening defined between two second ends of the first walls. The lateral part (18) extends between lower edges of the first walls. Each first wall of the upright portion (11) has a body (15), a head (14) and a neck (13) extended between the body and the head (14). A crease (12) is formed between the neck (13) and the body (15) to assist specific required deformation of the first wall. Each neck (13) is twisted at the crease (12) whereby an outward taper is defined from the second wall to the opening. Each body (15) has a protrusion (17) formed thereon and at the second end of the first wall.

Figures 3, 4:
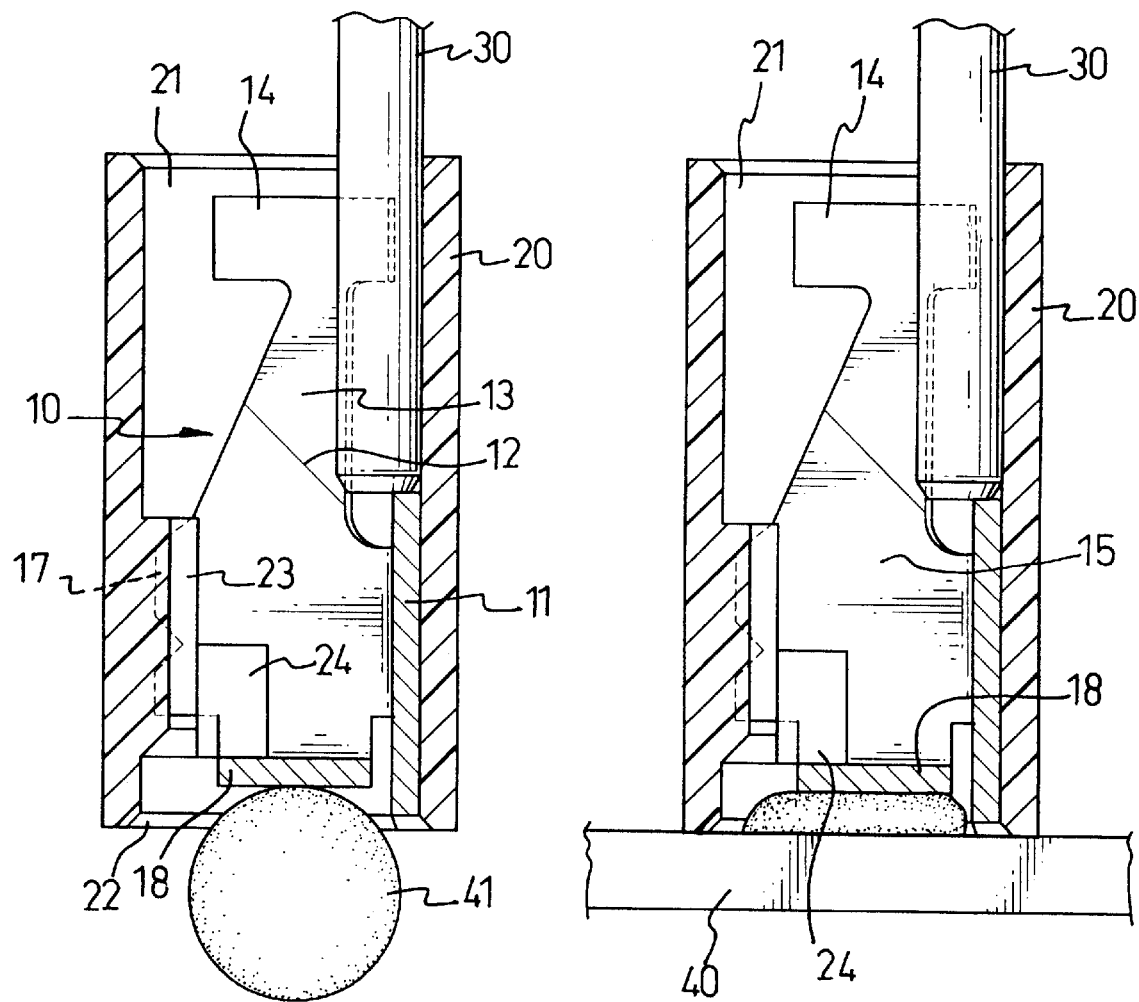
FIG. 3 is a side view in partial section of the connecting strip in FIG. 2 in an aperture of the socket.

With reference to FIGS. 1, 3 and 4, a socket (20) in which a CPU is mounted has a plurality of apertures (21) defined through the socket (20). Each aperture (21) has a top, a bottom opening (22), four inner walls and a stop (23) formed on one of the inner walls. Two recesses (231) are respectively defined at two sides of the stop (23). A rib (24) is formed on a middle portion of the stop (23).

The connecting strip (10) is inserted into the aperture (21) through the bottom opening (22) of the aperture (21). The second wall of the upright part (11) abuts the inner wall of the aperture opposite the stop (23). The protrusions (17) are respectively received in the recesses (231). The lateral part (18) is blocked by the rib (24). A solder ball (41) is formed under the lateral part (18) of connecting strip (10). As shown in FIG. 4, the socket (20) is bonded to a printed circuit board (40) by melting the solder ball (41), and the connecting strip (10) is electrically connected to a circuit on the main board (40).

Figure 5:
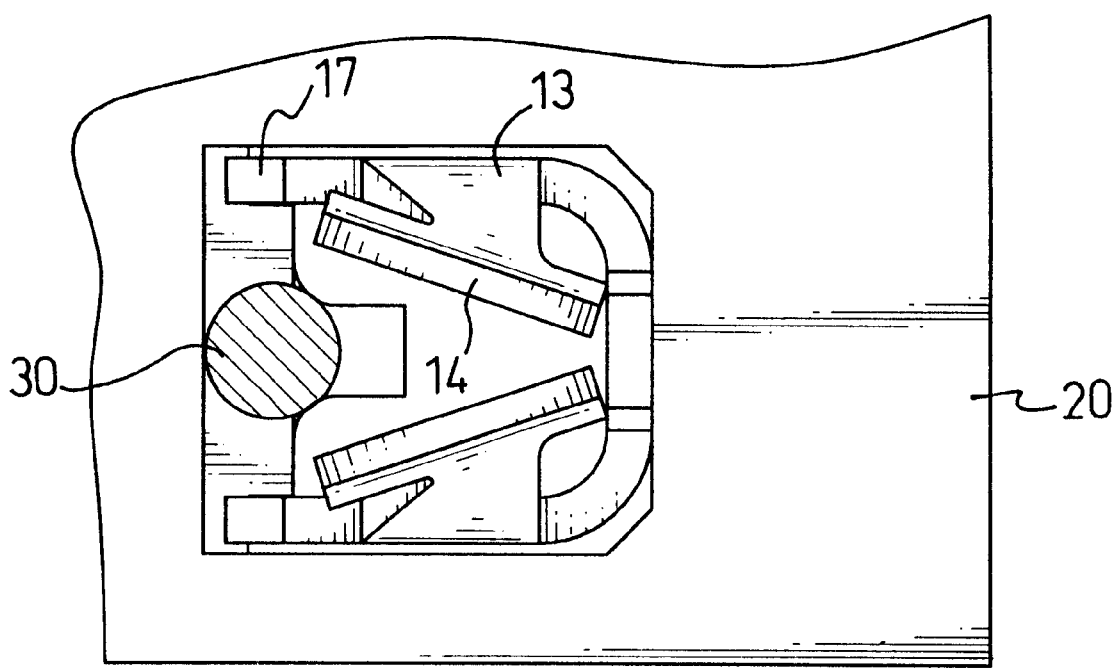
FIG. 5 is a top view of the connecting strip with a pin of a CPU inserted in the socket.
Figure 6:
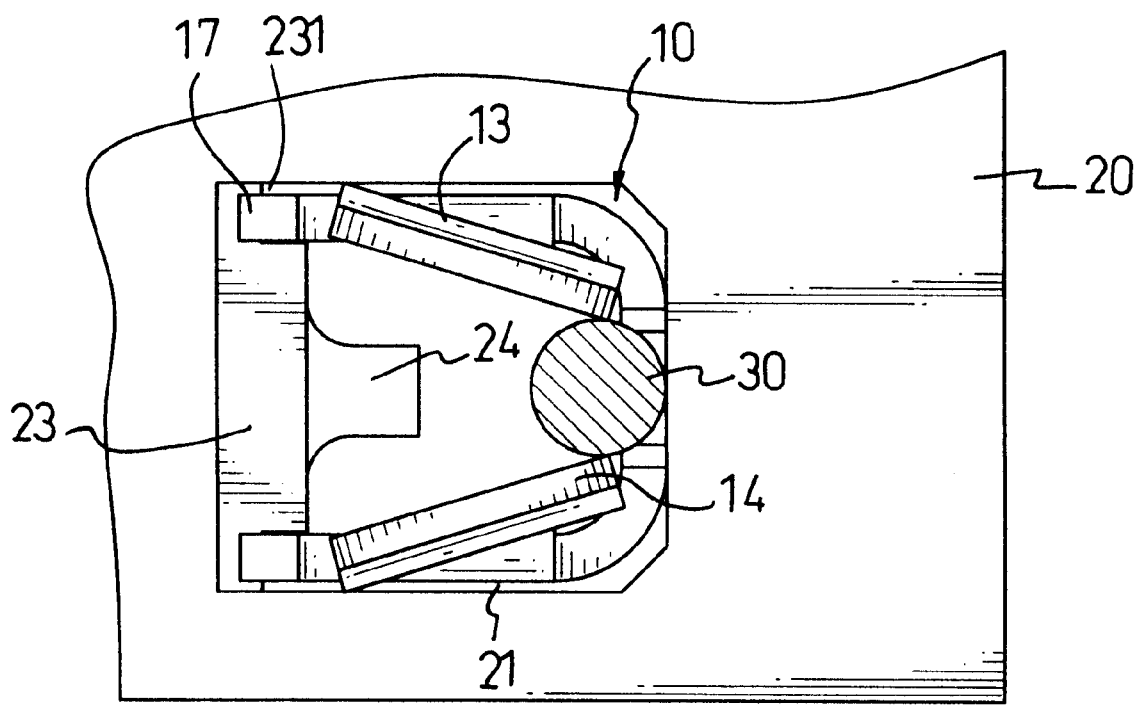
FIG. 6 is a top view of the connecting strip in electrical contact with the pin of the CPU in FIG. 5.

With reference to FIGS. 5–6, when a pin (30) of a CPU is inserted in the aperture (21), the pin (30) is first located at the opening of the connecting strip (10) and between the heads (14). After the pin (30) has been inserted into the aperture (21), a fastening means (not shown) on the socket (20) moves the CPU and the pin (30) toward the second wall of the connecting strip (10) and the pin (30) is clamped between the heads (14). The pin (30) is electrically connected to the connecting strip (10) due to being clamped between the heads (14).

Because the connecting strip (10) is inserted into the socket (20) through the bottom opening of the aperture (21) and secured to the printed circuit board (40) by the solder ball (41), the connecting strip (10) will not be pulled out of the aperture (21) when the CPU is removed from the socket (20).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket (20) defined in a printed circuit board, the socket comprising:

a plurality of apertures (21), the apertures (21) each having a top, a bottom opening (22), four inner walls, a stop (23) formed on one of the inner walls, two recesses (231) respectively defined at two sides of the stops (23), and a rib (24) formed on a middle portion of the stop (23); and a plurality of connecting strips (10) respectively inserted in the apertures (21) through the bottom openings (22) of the plurality of apertures (21), the plurality of connecting strips each having an upright portion (11) formed with two opposed first walls, a second wall extending between the first walls and an opening opposite the second wall, each first wall having a body, a head, and a neck extending between the head and the body, with each neck deformed such that an-outward taper is defined between the necks from the second wall to the opening; two protrusions (17) respectively formed on front ends of the first walls and received in the recesses (231); and, a lateral part (18) formed at the bottom of the upright portion (11) and blocked by the rib (24).

2. The socket as claimed in claim 1, wherein the connecting strips (10) each have a solder ball (41) under the lateral part (18) whereby the socket is bonded on a printed circuit board by melting the solder ball (41).

3. The socket as claimed in claim 1, wherein each first wall has a crease (16), whereby each neck is deformable at a desired position.

\* \* \* \* \*